US006948863B2

(12) United States Patent
Ito et al.

(10) Patent No.: US 6,948,863 B2
(45) Date of Patent: Sep. 27, 2005

(54) OPTICAL MODULE AND OPTICAL TRANSCEIVER MODULE

(75) Inventors: Makoto Ito, Yokohama (JP); Takeshi Sekiguchi, Yokohama (JP); Kenichiro Komoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 211 days.

(21) Appl. No.: 10/437,438

(22) Filed: May 14, 2003

(65) Prior Publication Data

US 2004/0008953 A1 Jan. 15, 2004

(30) Foreign Application Priority Data

May 14, 2002 (JP) ..................................... P2002-138977

(51) Int. Cl.⁷ ................................................ G02B 6/36
(52) U.S. Cl. ......................................... 385/92; 385/88
(58) Field of Search ..................................... 385/88–92

(56) References Cited

U.S. PATENT DOCUMENTS

| 4,399,453 A | * | 8/1983 | Berg et al. ................... 257/712 |
| 4,650,285 A | * | 3/1987 | Stevenson .............. 250/227.11 |
| 4,911,519 A | * | 3/1990 | Burton et al. .................. 385/14 |
| 5,099,307 A | * | 3/1992 | Go et al. ....................... 29/841 |
| 5,113,466 A | * | 5/1992 | Acarlar et al. ................. 385/88 |
| 5,170,453 A | * | 12/1992 | Go et al. ....................... 385/70 |
| 5,289,345 A | * | 2/1994 | Corradetti et al. ........... 361/752 |
| 5,416,871 A | * | 5/1995 | Takahashi et al. ............. 385/88 |
| 5,802,230 A | | 9/1998 | Kuribayasji et al. |
| 6,062,893 A | * | 5/2000 | Miskin et al. ............... 439/374 |
| 6,164,838 A | * | 12/2000 | Maehara et al. ............... 385/92 |
| 6,206,582 B1 | | 3/2001 | Gilliland |
| 6,239,427 B1 | * | 5/2001 | Mizue ......................... 250/239 |
| 6,540,412 B2 | * | 4/2003 | Yonemura et al. ............. 385/88 |
| 6,565,267 B2 | * | 5/2003 | Abe et al. ...................... 385/68 |
| 6,840,680 B1 | * | 1/2005 | Chiu et al. ..................... 385/53 |
| 6,840,686 B2 | * | 1/2005 | Jiang et al. .................... 385/92 |
| 6,843,609 B2 | * | 1/2005 | Yonemura ..................... 385/93 |
| 2001/0024551 A1 | | 9/2001 | Yonemura et al. |

FOREIGN PATENT DOCUMENTS

| EP | 0 381 370 A2 | 8/1990 |
| EP | 0 573 941 A1 | 12/1993 |
| EP | 0 690 323 A2 | 1/1996 |

* cited by examiner

*Primary Examiner*—Ellen E. Kim
(74) *Attorney, Agent, or Firm*—McDermott Will & Emery LLP

(57) ABSTRACT

An optical module includes a light-receiving sub-module, wiring board, and package. The light-receiving sub-module has a device portion and guide portion. The device portion has a stem, a plurality of lead pins, and a semiconductor light-receiving device. The wiring board is placed so that one end is located near the stem. Some lead pins extend straight and are connected to wirings on the wiring board. The package accommodates the device portion and wiring board. Since the package is made of a metal, the leakage of signals transmitted through the device portion and wiring board is suppressed. In addition, since the end of the wiring board is located near the stem, a short signal transmission path is formed between the wiring board and the optical device, thereby suppressing attenuation of the transmitted signals.

6 Claims, 14 Drawing Sheets

OPTICAL MODULE AND OPTICAL TRANSCEIVER MODULE

BACKGROUND OF THE INVENTION

1. Field of the Invention

The present invention relates to an optical module and optical transceiver module.

2. Related Background Art

Developments have been made in optical transceivers based on the XENPAK MSA (Multi Source Agreement) as an MSA relating to 10 Gigabit optical Ethernet. The XENPAK MSA conforms to the 10 Gigabit Ethernet standard IEEE802.3ae. The XENPAK MSA standardizes the electric standards of transceiver modules which operate at a speed of 10 GHz, and realizes a hub which operates at 10 GHz by installing a plurality of transceiver modules with standard packages each having outer dimensions of 120 mm×50 mm×8.3 mm. In the XENPAK MSA, an optical module that operates at 10 GHz is required.

An optical module disclosed in U.S. Pat. No. 5,170,453 is known, a configuration of which includes an island portion, an optical device and a molded resin. The island portion places electronic parts thereon. The optical device is placed apart from the island portion and electrically connected to the island portion. The optical device has an optical axis aligned with an optical connector and is integrally fixed with the optical connector. The resin encapsulates and holds the island portion and optical device.

In the optical module disclosed in U.S. Pat. No. 5,170,453, although productivity and cost are taken into consideration, no consideration is given to leakage and loss of transmitted electric signals. For this reason, when the optical module operates over several GHz, problems may occur in terms of the leakage and loss of the transmitted electric signals.

SUMMARY OF THE INVENTION

One aspect of an optical module of the present invention is to suppress leakage and loss of transmitted signals.

An optical module according to the present invention includes a semiconductor optical device, a stem, a plurality of lead pins, a sleeve, a wiring board, and a package. The stem has a mounting surface on which the semiconductor optical device is mounted and a back surface opposite to the mounting surface. The lead pins are inserted into the stem. Each lead pin has a first end portion which is exposed on the mounting surface of the stem and electrically connected to the semiconductor optical device, and a second end portion protruding from the back surface of the stem. The sleeve has a first end portion to which the stem is fixed and a second end portion including an opening into which a ferrule is inserted. The wiring board has an end portion located near the back surface of the stem. The wiring board also has a plurality of wirings extending to the end portion of the wiring board. The second end portions of the lead pins are connected to the wirings. The package encloses the first end portion of the sleeve and the wiring board. The package has a base and lid. An end portion of the wiring board may abut the back surface of the stem. The lead pin may be soldered to the wiring on the wiring board.

Since the stem and the wiring board are enclosed in the package, leakage of transmitted signals can be suppressed. In addition, since the end portion of the wiring board is located near the back surface of the stem from which the lead pin protrudes, the signal transmission path formed between the wiring board and the semiconductor optical device can be shortened. Therefore, it is able to suppress attenuation of the transmitted signals.

The plurality of lead pins may include a signal pin and a ground pin. The signal pin is for transmitting an output signal from the semiconductor optical device or an input signal to the semiconductor optical device. The signal pin and ground pin may extend straight to the wirings on the wiring board. In this case, the attenuation of the signals transmitted through the signal pin can be further suppressed.

The base of the package may have a board mounting portion on which the wiring board is mounted. The board mounting portion may have a height at which the signal pin and ground pin extending straight can be connected to the wirings when the wiring board is mounted on the board mounting portion. In this case, an arrangement which can reliably connect the signal pin and ground pin to the wirings while the pins extend straight can be easily realized at a low cost.

The base of the package may have a pair of protrusions for attaching the base to an external board. The pair of protrusions may be provided at only two positions 180° rotationally symmetric about the center of the base. When a plurality of optical modules are mounted on the external board, the optical modules can be placed in parallel without interference between the protrusions of the optical modules. This reduces the mounting space for the optical modules on the external board.

The base of the package may have a contact surface and a pair of protrusions. The contact surface is substantially flat and abuts an external board when the base is fixed to the external board. The pair of protrusions protrudes in opposite directions from the base. Each protrusion has a hole for fastening the base to the external board, and a bottom surface substantially flush with the contact surface. The pair of protrusions may be provided at only two positions 180° rotationally symmetric about an axis which is perpendicular to the contact surface and extends through the center of the package. When a plurality of optical modules are mounted on the external board, the optical modules can be placed in parallel without interference between the protrusions of the optical modules. This reduces the mounting space of the optical modules.

The lead pin may be a signal pin for transmitting an output signal from the semiconductor optical device or an input signal to the semiconductor optical device. The wirings on the wiring board may include a signal wiring connected to the signal pin, and ground wirings provided on the both sides of the signal wiring. The optical module may further include an auxiliary wiring for electrically connecting the ground wirings to the stem. In this case, the impedance of the signal wiring can be easily decreased.

Another aspect of the present invention provides an optical transceiver module. The optical transceiver module includes first and second optical modules described above.

In the first optical module, the semiconductor optical device is a semiconductor light-receiving device for receiving an optical signal to generate a photocurrent corresponding to the optical signal. The first optical module further includes a preamplifier and main amplifier. The preamplifier is placed on the mounting surface of the stem. The preamplifier receives a photocurrent from the light-receiving device to generate an electric signal corresponding to the photocurrent. The main amplifier is placed on the wiring board and amplifies the signal generated by the preamplifier. A wiring on the wiring board extends from the main amplifier to an end portion of the wiring board which is located near the back surface of the stem.

In the second optical module, the semiconductor optical device is a semiconductor light-emitting device for emitting light in response to an electric driving signal. The second optical module further includes a driving circuit of a light-emitting device, which is placed on the wiring board and generates the driving signal for the light-emitting device. The wiring on the wiring board extends from the driving circuit to the end portion of the wiring board which is located near the back surface of the stem.

Each base of the first and second optical modules may have a pair of protrusions for fixing the base to an external board. In each optical module, the pair of protrusions may be provided at only two positions 180° rotationally symmetric about the center of the base. The first and second optical modules may be placed in parallel without interference between the protrusions of the first and second modules. This makes the optical transceiver module very compact.

Each base of the first and second optical modules may have a contact surface and a pair of protrusions. The contact surface is substantially flat and abuts an external board when the base is fixed to the external board. The pair of protrusions protrudes in opposite directions from the base. Each protrusion has a hole for fastening the base to the external board, and a bottom surface substantially flush with the contact surface. The pair of protrusions may be provided at only two positions 180° rotationally symmetric about an axis which is perpendicular to the contact surface and extends through the center of the package. The first and second optical modules may be placed in parallel without interference between the protrusions of the first and second modules. This makes the transceiver module very compact.

Further scope of the present invention will become apparent from the detailed description given hereinafter. However, it should be understood that the detailed description and specific examples, while indicating preferred embodiments of the invention, are given by way of illustration only, since various changes and modifications in the spirit and scope of the invention will become apparent to those skilled in the art from this detailed description.

DETAILED DESCRIPTION OF THE PREFERRED EMBODIMENTS

Figure 1:
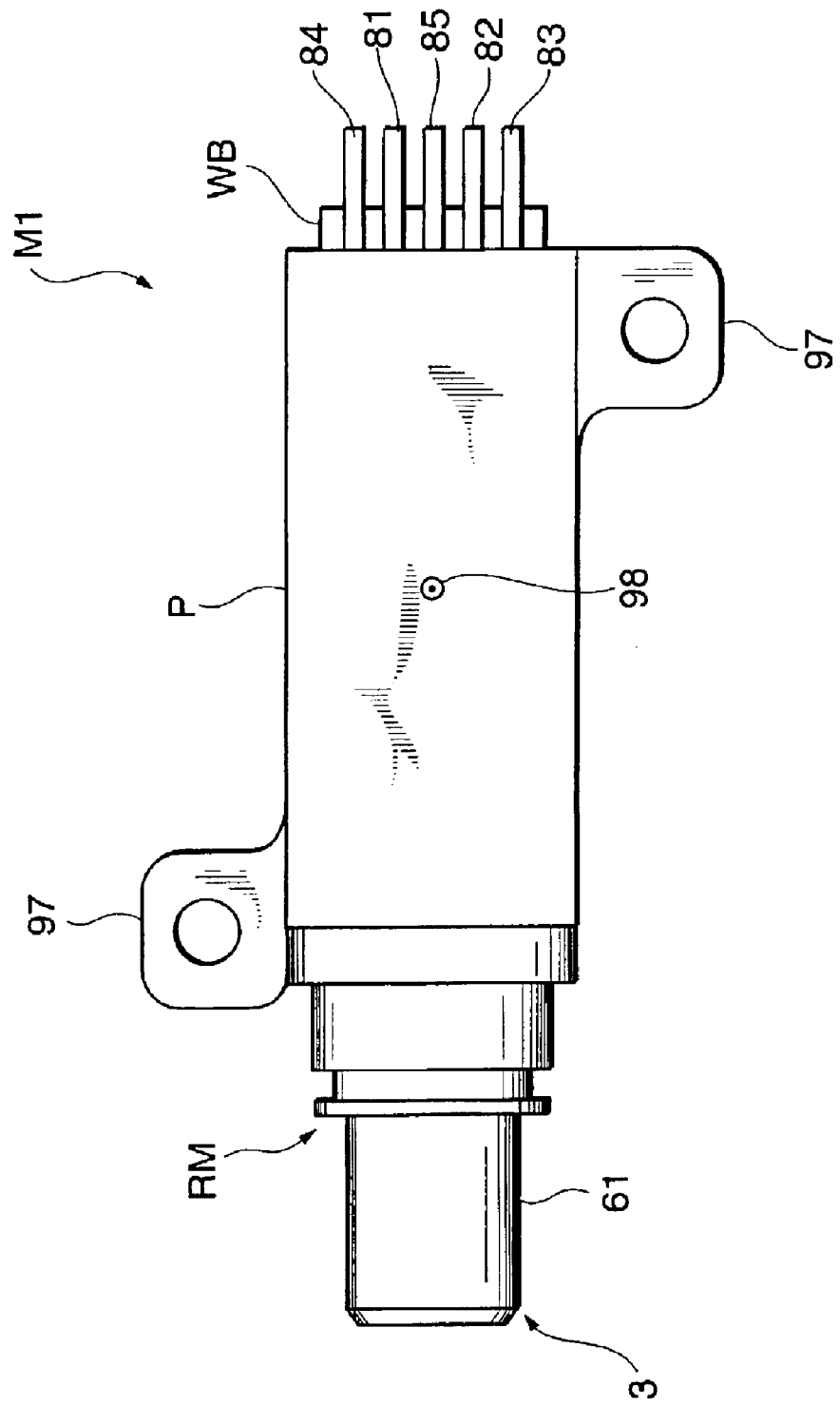
FIG. 1 is a plan view showing an optical module according to a first embodiment of the present invention.
Figure 2:
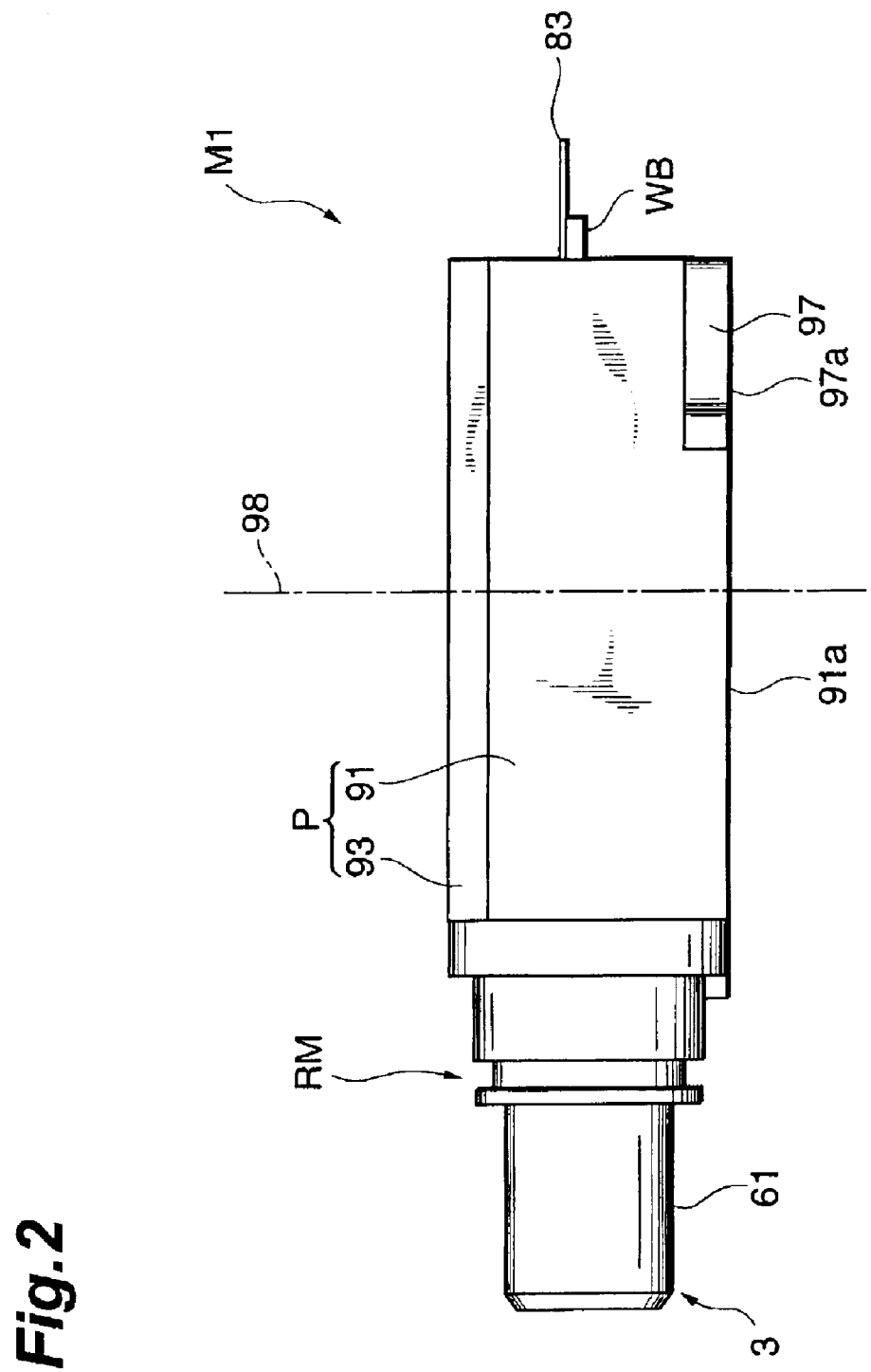
FIG. 2 a side view showing the optical module according to the first embodiment.
Figure 3:
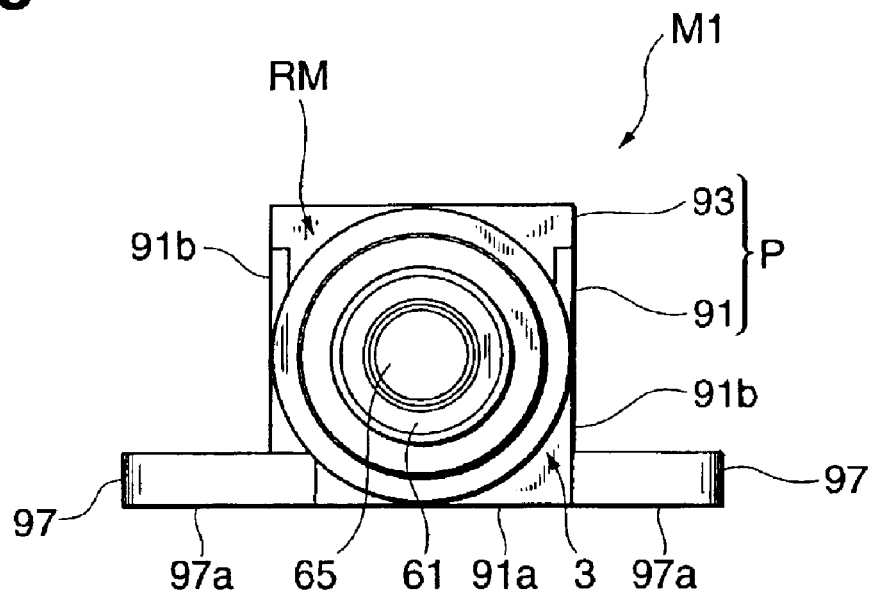
FIG. 3 is a front view showing the optical module according to the first embodiment.
Figure 4:
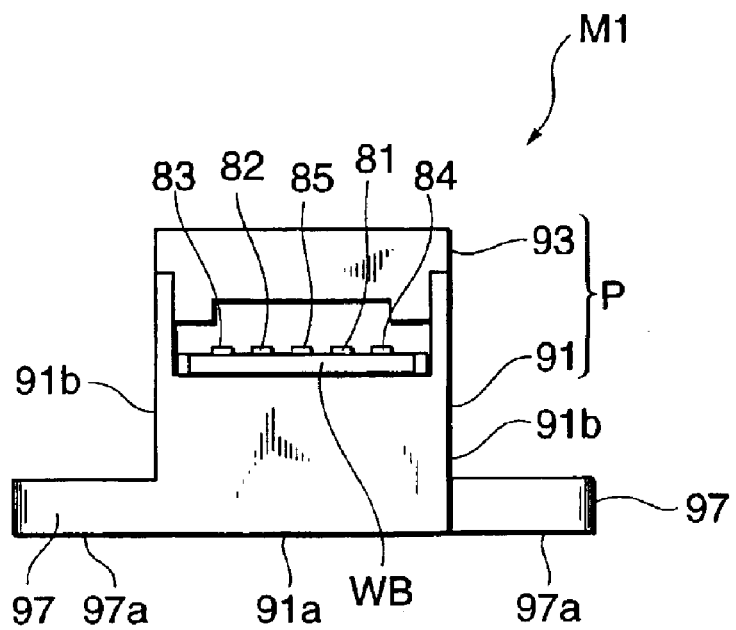
FIG. 4 is a rear view showing the optical module according to the first embodiment.

The preferred embodiments of the present invention will be described below in greater detail with reference to the accompanying drawings. To facilitate understanding, identical reference numerals have been used, where possible, to designate identical or equivalent elements that are common to the figures without repeating the overlapping descriptions.

First Embodiment

Figure 5:
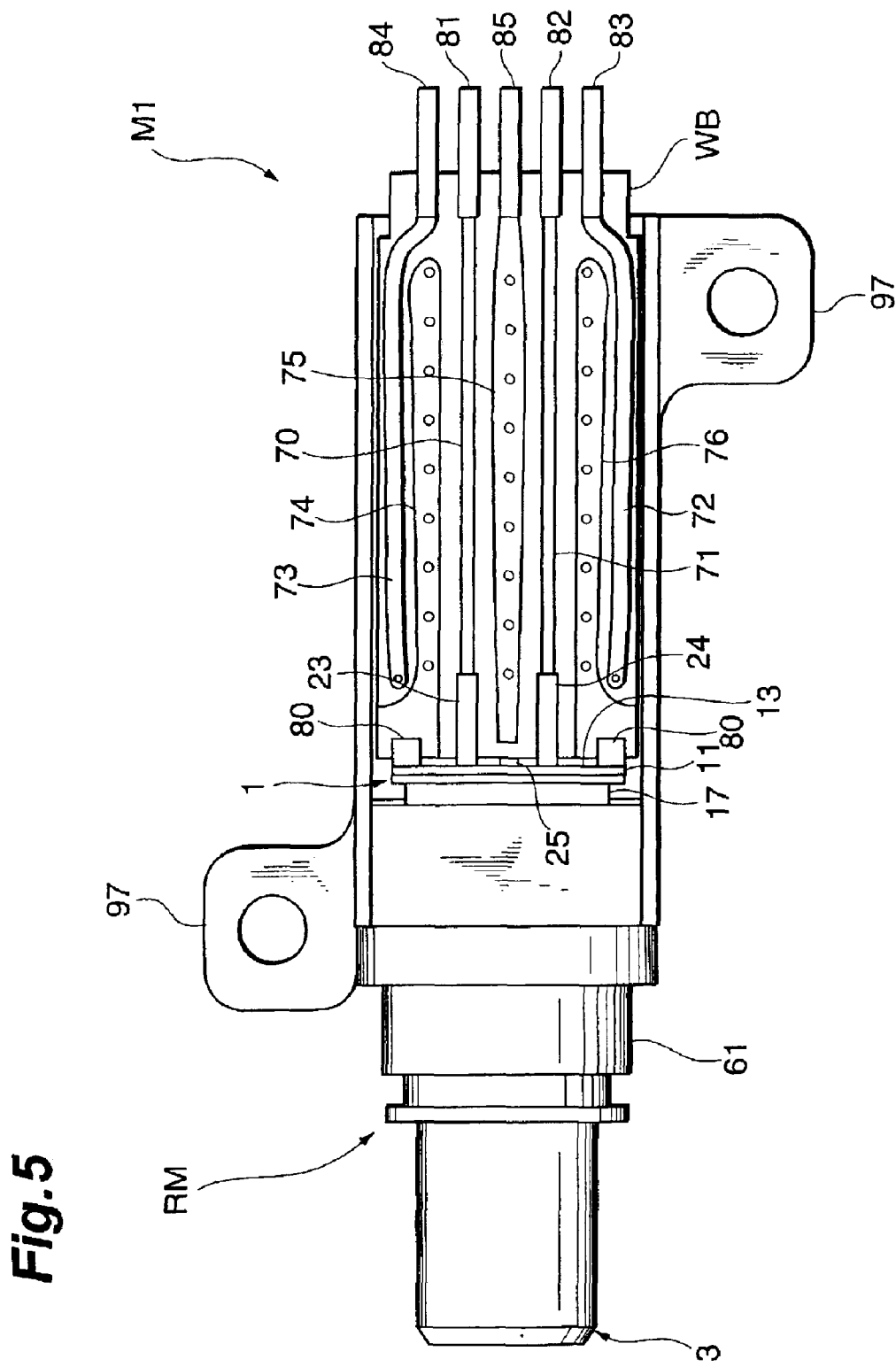
FIG. 5 is a plan view showing the optical module according to the first embodiment when a lid is removed.
Figure 6:
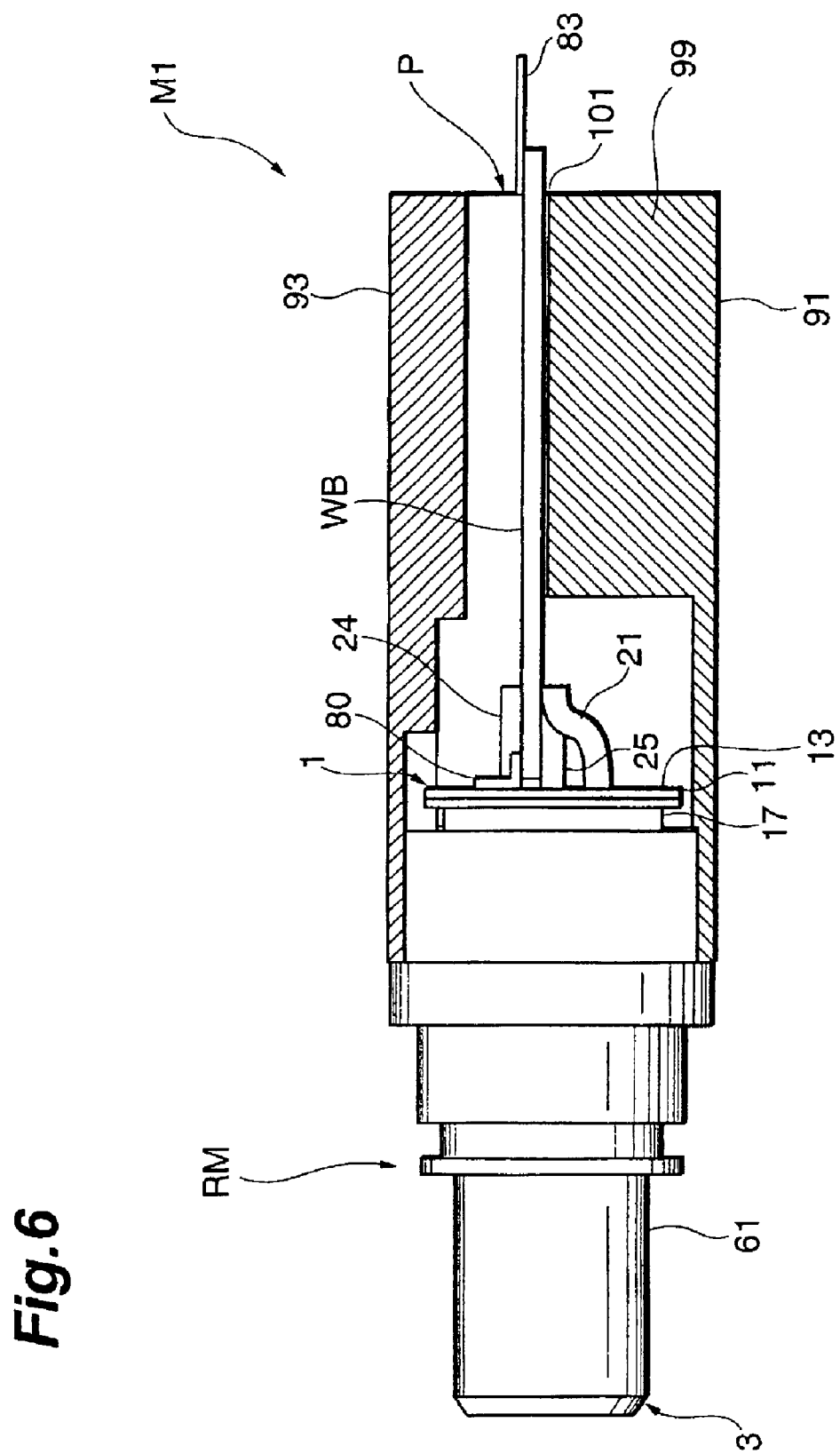
FIG. 6 is a partially cutaway sectional view of the housing of the optical module according to the first embodiment.

FIGS. 1 to 4 are a plan view, side view, front view and rear view showing an optical module according to this embodiment. FIG. 5 is a plan view showing the optical module when a lid is removed. FIG. 6 is a partially cutaway sectional view of the housing. An optical module M1 is, for example, a receiver optical sub-assembly (ROSA) of an optical communication module. The optical module M1 includes a light-receiving sub-module RM, wiring board WB, and package P, as shown in FIGS. 1 to 6.

Figure 7:
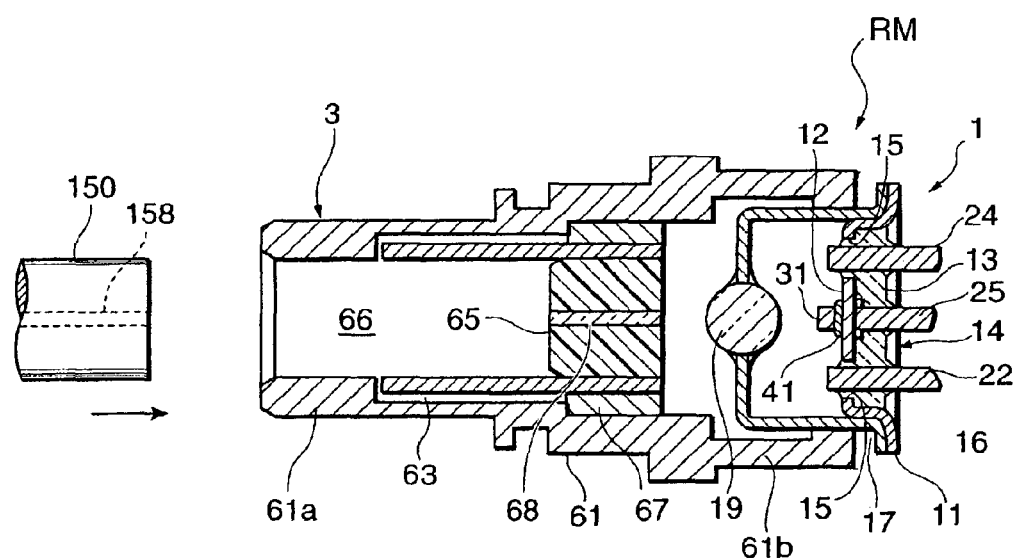
FIG. 7 is a sectional view showing a light-receiving sub-module included in the optical module according to the first embodiment.

FIG. 7 is a sectional view of the light-receiving sub-module RM. As shown in FIG. 7, the light-receiving sub-module RM has a device mounting portion 1 and a fiber guiding portion 3. The device portion 1 and guide portion 3 are fixed to each other with an adhesive (not shown).

Figure 8:
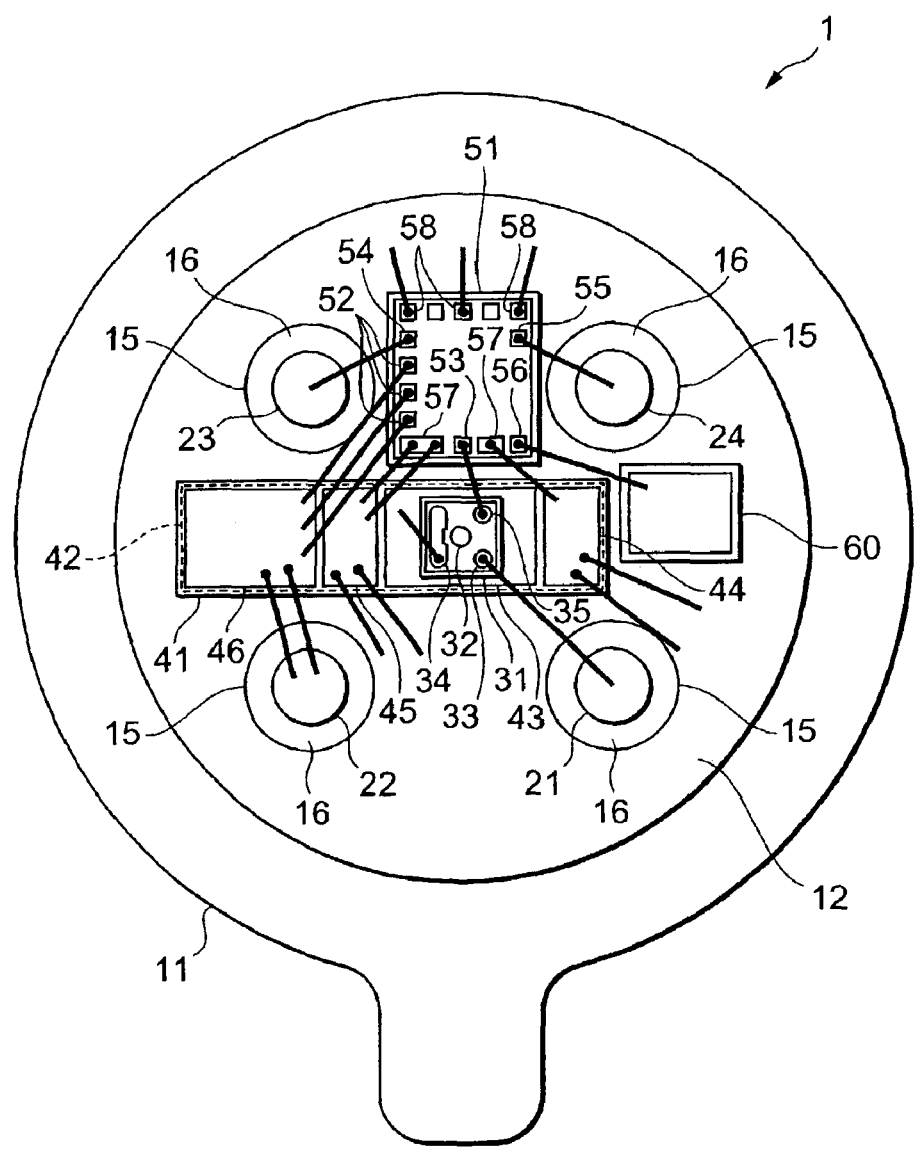
FIG. 8 is a plan view showing the arrangement of a device portion included in the light-receiving sub-module of the optical module according to the first embodiment.
Figure 9:
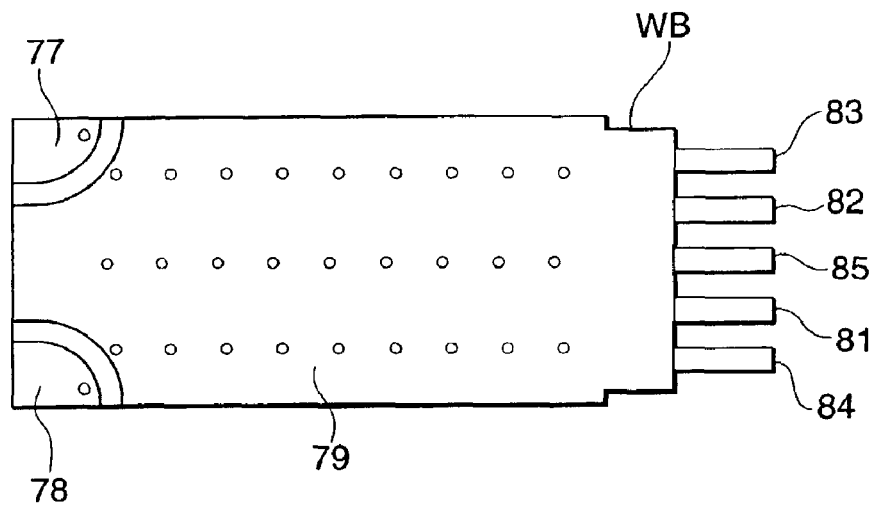
FIG. 9 is a plan view showing a wiring board included in the optical module according to the first embodiment.

FIG. 8 is a plan view showing the configuration of the device mounting portion 1. As shown in FIGS. 7 and 8, the device mounting portion 1 includes a stem 11, a lens holder 17 for holding a lens 19, a plurality of (five in this embodiment) lead pins 21 to 25, a semiconductor light-receiving device 31, a semiconductor electronic device 51, and the like.

The lens holder 17 is made of a metal such as stainless steel and provided in contact with the edge of the stem 11. The lens holder 17 has an opening facing the semiconductor light-receiving device 31. The lens 19 is fixed in this opening with an adhesive. A glass lens, plastic lens or the like can be used as the lens 19.

As shown in FIG. 8, the stem 11 has a mounting surface 12 on which components such as the semiconductor light-receiving device 31, a die-capacitor 41, and the semiconductor electronic device 51 are mounted. The mounting surface 12 has a diameter of about 4.22 mm. The stem 11 is made of a metal such as Kovar, an Fe—Ni alloy or CuW, and plated with gold. The stem 11 has a plurality of (four in this embodiment) through holes 15 extending from the mounting surface 12 to the back surface 13 of the stem 11. The lead pins 21 to 24 extend through these holes 15, respectively.

The lead pins 21 to 24 extend through the corresponding holes 15 so that one end of each pin protrudes from the mounting surface 12 by a predetermined length (e.g., about 0.35 mm), and are fixed to the stem 11. The other end of each of the lead pins 21 to 24 protrudes from the back surface 13. The lead pins 21 to 24 are insulated from the stem 11 by sealing with a glass member 16.

The lead pin 21 is for applying power supply voltage $V_{PD}$ to the semiconductor light-receiving device 31. The lead pin 22 is for applying power supply voltage $V_{DD}$ to the semiconductor electronic device 51. The lead pins 23 and 24 are signal pins for outputting signals electrically processed by the semiconductor electronic device 51. The lead pin 25 is a ground pin and fixed to the stem 11 while being electrically connected to the stem 11. One end of the lead pin 25 protrudes from the back surface 13 of the stem 11. These lead pins 21 to 25 are made of a metal such as Kovar, and have an outer diameter of about 0.45 mm.

The die-capacitor 41 has an electrode 42 on the surfaces. The electrode 42 is in contact with the mounting surface 12. The die-capacitor 41 also has at least three (four in this embodiment) electrodes 43 to 46 placed side-by-side on the other surface. The die-capacitor 41 is placed so that the electrode 43 is positioned on the central portion of the mounting surface 12. The electrode 42 is electrically connected to the stem 11. The die-capacitor 41 has a size of 0.7 mm×2.6 mm×0.2 mm. The electrode 43 has a size of 0.9 mm×0.6 mm. Each of the electrodes 44 and 45 has a size of 0.3 mm×0.6 mm. The electrode 46 has a size of 0.8 mm×0.6 mm.

The electrodes 44 and 45 are located on the both sides of the electrode 43. The electrodes 44 and 45 are wire-bonded and electrically connected to the stem 11 to be at ground potential. A plurality of (two in this embodiment) wires are used to electrically connect the electrodes 44 and 45 to the stem 11. The outermost electrode 46 is wire-bonded to the lead pin 22. A plurality of (two in this embodiment) wires are used to electrically connect the electrode 46 to the lead pin 22.

The semiconductor light-receiving device 31 is, for example, a photodiode. The light-receiving device 31 has a light-sensing region 32, a first electrode 33 (power supply electrode), and second and third electrodes 34 and 35 (signal output electrodes). The light-receiving device 31 has a resistor (not shown) connected in series between the first electrode 33 and the second electrode 34, and a diode (not shown) connected in parallel with the resistor. The light-receiving device 31 has a size of 0.5 mm×0.5 mm. The light-receiving device 31 is placed on the electrode 43 of the die-capacitor 41. In other words, the die-capacitor 41 is placed so that the light-receiving device 31 (light-receiving portion 32) placed on the electrode 43 is located on the central portion of the mounting surface 12.

The first electrode 33 is for applying a power supply voltage $V_{PD}$ to the light-receiving device 31, and is placed near one of the corners of the light-receiving device 31. The first electrode 33 is wire-bonded to the lead pin 21. Therefore, the power supply voltage $V_{PD}$ is applied to the light-receiving device 31 through the lead pin 21 and the bonding wire.

The third electrode 35 is for outputting an electric signal that light incident on the light-receiving portion 32 is converted thereinto. In the light-receiving device 31, the third electrode 35 is placed near the corner adjacent to the corner where the first electrode 33 is placed.

The second electrode 34 is provided along one side of the light-receiving device 31 opposite to the corners where the first and third electrodes 33 and 35 are placed. The second electrode 34 is wire-bonded to the electrode 43 of the die-capacitor 41. As a result, the die-capacitor 41, more specifically the capacitor constituted by the electrodes 42 and 43, and a resistor within the light-receiving device 31 constitute a CR filter. This enables the light-receiving device 31 to operate stably.

The semiconductor electronic device 51 is, for example, a pre-amplifier IC. The electronic device 51 performs electric processing (e.g., current/voltage conversion and amplification) for the electric signal output from the light-receiving device 31. The electronic device 51 has a first electrode 52 (power supply electrode), a second electrode 53 (signal input electrode), a third electrode 54 (signal output electrode), a fourth electrode 55 (signal output electrode), a fifth electrode 56, ground electrodes 57 and 58, and the like. The electronic device 51 is placed adjacent to the die-capacitor 41 so that the second electrode 53 faces the third electrode 35 of the light-receiving device 31. In this embodiment, the electronic device 51 is placed between the lead pins 23 and 24.

The first electrode 52 is for applying a power supply voltage to the electronic device 51. The first electrode 52 is wire-bonded and electrically connected to the electrode 46 which is the outermost electrode of die-capacitor 41. Therefore, the power supply voltage is applied to the electronic device 51 through the lead pin 22, the electrode 46 of the die-capacitor 41 and the wire. A plurality of (three in this embodiment) wires are used to electrically connect the first electrode 52 to the electrode 46.

The second electrode 53 is for inputting the electric signal from the light-receiving device 31. The second electrode 53 is wire-bonded to the third electrode 35 of the light-receiving device 31.

The third electrode 54 is for outputting the signal obtained by electrically processing the electric signal output from the light-receiving device 31. The third electrode 54 is wire-bonded to the lead pin 23. Therefore, the signal electrically processed by the electronic device 51 is output through the wire and lead pin 23.

The fourth electrode 55 is for outputting a signal complementary to the signal output from the third electrode 54. The fourth electrode 55 is wire-bonded to the lead pin 24. Therefore, the complementary signal electrically processed by the electronic device 51 is output through the wire and lead pin 24.

The third and fourth electrodes 54 and 55 are respectively placed near the sides of the electronic device 51 which are opposing to each other and perpendicular to the side where the second electrode 53 is placed, i.e., the sides near the lead pins 23 and 24.

The fifth electrode 56 is wire-bonded to a die-capacitor 60. The die-capacitor 60 serves as a filtering capacitor used in the internal circuit of the semiconductor electronic device 51 to determine the cutoff frequency of a low-pass-filter.

The ground electrodes 57 are provided on the both sides of the second electrode 53 and respectively wire-bonded and electrically connected to the electrodes 44 and 45 of the die-capacitor 41. Therefore, the ground electrodes 57 are electrically connected to the stem 11 through the electrodes 44 and 45 and wires to be at ground potential.

Each of the ground electrodes 58 is wire-bonded to the mounting surface 12 to be at ground potential.

As shown in FIG. 7, the fiber guiding portion 3 has a sleeve 61, split sleeve 63, capillary 65, and the like. The sleeve 61 has a cylindrical shape. The stem 11 is placed on the distal end portion 61a of the sleeve 61. The proximal end 61b of the sleeve 61 has an opening 66 into which a ferrule 150 is to be inserted. The sleeve 61 forms a part of an SC type receptacle. The sleeve 61 is made of a metal such as stainless steel. The distal end portion 61a of the sleeve 61 surrounding the opening 66 has an inner diameter of 2.5 mm and an outer diameter of 4.15 mm.

The split sleeve 63 is placed inside the sleeve 61 and positions the capillary 65. The capillary 65 is made of a ceramics such as zirconia and secures an optical fiber 68. When the ferrule 150 is inserted into the opening 66, an optical fiber 158 in the ferrule 150 is optically coupled to the optical fiber 68 in the capillary 65. The split sleeve 63 is made of a ceramics such as zirconia and fixed to the sleeve 61 using a fixing member 67.

The wiring board WB has wirings to which the lead pins 21 to 25 are connected. As shown in FIGS. 5 to 9, the wirings include first to seventh wirings 70 to 76 formed on one of the major surfaces of the wiring board WB, and also include eighth to tenth wirings 77 to 79 formed on the other surface.

Figure 10:
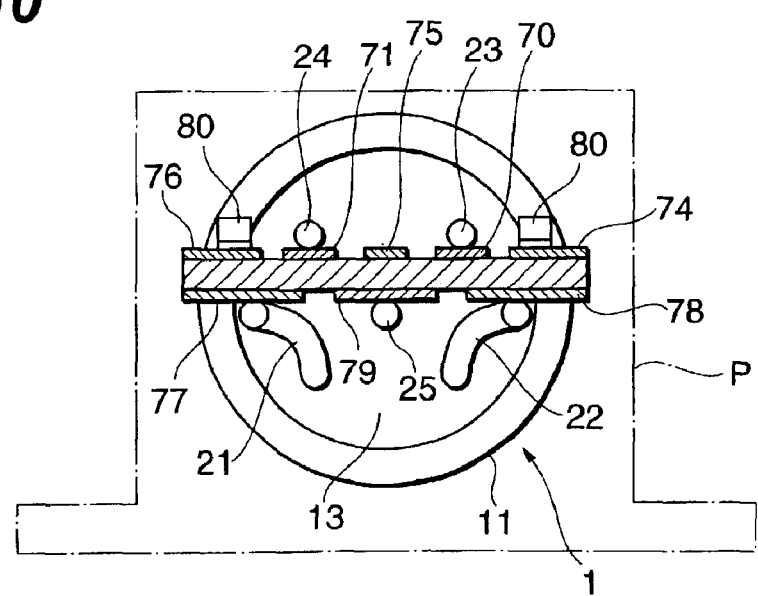
FIG. 10 is a view showing the light-receiving sub-module and wiring board included in the optical module according to the first embodiment.

As shown in FIGS. 5, 6 and 10, the wiring board WB is placed so that a plane including the central axes of the two lead pins 23 and 24 is almost parallel to the wiring board WB, and one end of the wiring board WB is located near the back surface 13 of the stem 11. The back surface 13 of the stem 11 may contact to one end of the wiring board WB. The wiring board WB is placed so that the lead pins 23, 24 and 25 extending straight can be connected to the wirings formed on the wiring board WB.

The lead pin 23 is soldered to the first wiring 70 at one end of the wiring board WB. The first wiring 70 extends to a lead terminal 81 provided on the opposite end of the wiring board WB. Therefore, the signal output from the lead pin 23 is guided outside the wiring board WB through the first wiring 70 and the lead terminal 81.

The lead pin 24 is soldered to the second wiring 71 at one end of the wiring board WB. The second wiring 71 extends to a lead terminal 82 provided on the opposite end of the wiring board WB. Therefore, the signal output from the lead pin 24 is guided outside the wiring board WB through the second wiring 71 and the lead terminal 82.

The lead pin 21 is soldered to the eighth wiring 77 at one end of the wiring board WB. The eighth wiring 77 is connected to the third wiring 72 through a via. The third wiring 72 extends to a lead terminal 83 provided on the opposite end of the wiring board WB. Therefore, the power supply voltage $V_{PD}$ is applied from outside the wiring board WB to the lead pin 21 through the lead terminal 83 and the third and eighth wirings 72 and 77.

The lead pin 22 is soldered to the ninth wiring 78 at one end of the wiring board WB. The ninth wiring 78 is connected to the fourth wiring 73 through a via. The fourth wiring 73 extends to a lead terminal 84 provided on the opposite end of the wiring board WB. Therefore, the power supply voltage $V_{DD}$ is applied from outside the wiring board WB to the lead pin 22 through the lead terminal 84 and the fourth and ninth wirings 73 and 78.

The lead pin 25 is connected to the tenth wiring 79 at one end of the wiring board WB. The tenth wiring 79 is connected to the fifth to seventh wirings 74, 75, and 76 through vias. The sixth wiring 75 extends to a lead terminal 85 provided on the opposite end of the wiring board WB. Therefore, the lead pin 25 is grounded through the tenth and sixth wirings 79 and 75 and the lead terminal 85. The fifth to seventh wirings 74, 75 and 76 constitute ground wirings.

As shown in FIGS. 5 and 6, the fifth and seventh wirings 74 and 76 are electrically connected to the stem 11 using auxiliary wiring members (e.g., conductive sheets) 80.

The fifth and sixth wirings 74 and 75 are located on the both sides of the first wiring 70. Consequently, the first wiring 70 is surrounded by the ground wirings. The sixth and seventh wirings 75 and 76 are located on the both sides of the second wiring 71. Consequently, the second wiring 71 is surrounded by the ground wirings.

Figure 11:
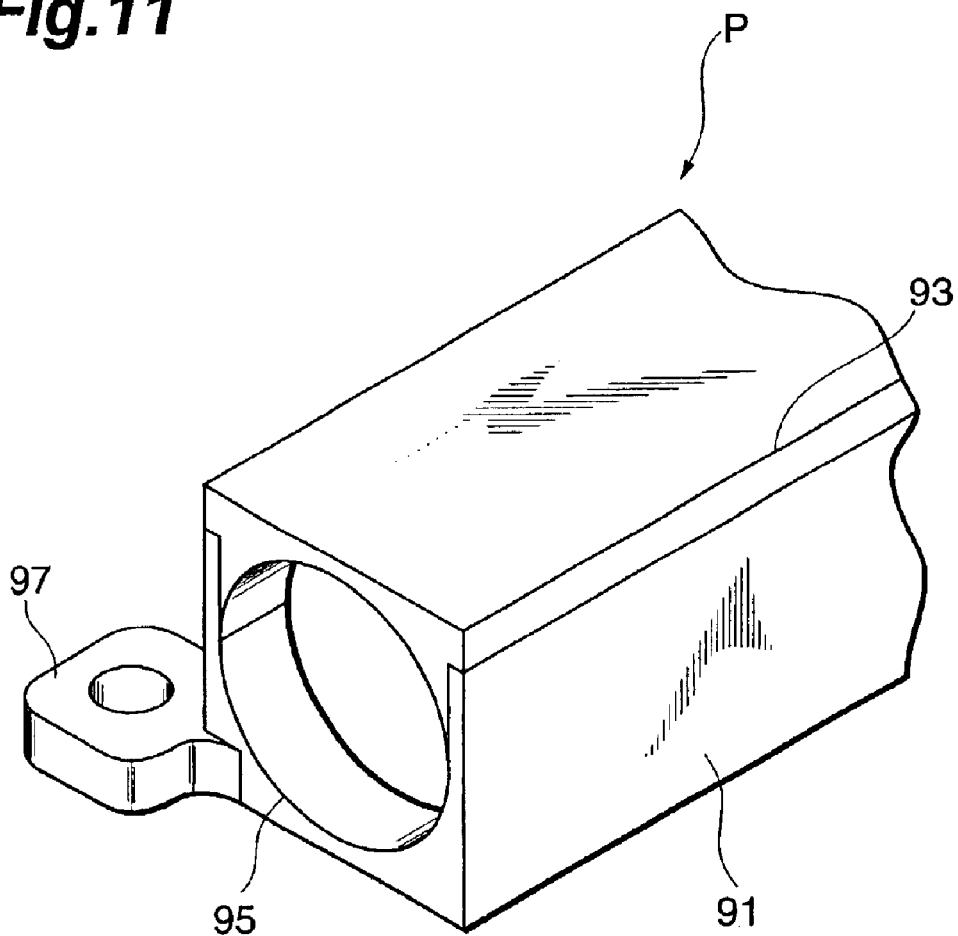
FIG. 11 is a perspective view showing a package included in the optical module according to the first embodiment.

The package P consists of a base 91 and lid 93, and has a substantially rectangular parallelepiped shape. The package P encloses the proximal end portion 61b of the sleeve 61 and the wiring board WB. The package P also encloses the device mounting portion 1 mounted on the proximal end 61b of the sleeve 61. The base 91 and the lid 93 are made of a metal such as aluminum. As shown in FIG. 11, an opening 95 is formed in one end of the package P. The opening 95 is defined by the base 91 and the lid 93. The light-receiving sub-module RM is fixed to the package P while the proximal end 61b of the sleeve 61 is inserted into the opening 95.

The base 91 has a pair of protrusions 97 which is used to fix the base 91 to an external board (not shown). Each protrusion 97 is a flat plate having a hole used to fasten the base 91 to the external board. The protrusions 97 are formed at only two positions which are 180° rotationally symmetric about the center of the base 91.

The positional relationship between the base 91 and the protrusions 97 will now be described in more detail with reference to FIGS. 1 to 4. When the package P is mounted on an external board, the bottom surface 91a of the base 91 abuts the external board. The bottom surface 91a is substantially flat. The pair of protrusions 97 protrudes in opposite directions from two side surfaces 91b of the base 91. The bottom surfaces 97a of the protrusions 97 are substantially flush with the bottom surface 91a of the base 91. These protrusions 97 are placed at only two positions 180° rotationally symmetric about an axis 98 which is perpendicular to the bottom surface 91a and extends through the center of the package P.

The base 91 includes a board mounting portion 99 on which the wiring board WB is to be mounted. The wiring board WB is fixed to the board mounting portion 99 with a conductive adhesive 101. The board mounting portion 99 has a height at which the lead pins 23, 24 and 25 extending straight can be connected to the wirings on the wiring board WB when the wiring board WB is mounted on the board mounting portion 99.

The advantages of the embodiment will now be described. Since the device mounting portion 1 of the light-receiving sub-module RM and the wiring board WB are enclosed in the package P comprised of the metal base 91 and metal lid 93, the leakage of the transmitted signals can be suppressed. In addition, since one end of the wiring board WB is located near the back surface 13 of the stem 11 of the sub-module RM, a signal transmission path from the light-receiving device 31 to the wiring board WB can be shortened. This suppresses the deterioration of the transmitted signals due to attenuation thereof.

The wiring board WB is placed so that the lead pins 23, 24 and 25 can extend straight to the wirings. This further suppresses the attenuation of the transmitted signals through the lead pins 23 and 24.

The base 91 has the board mounting portion 99 on which the wiring board WB is mounted. The board mounting portion 99 is set to have a height at which the lead pins 23, 24 and 25 extending straight can be connected to the wirings when the wiring board WB is mounted on the board mounting portion 99. This easily realizes an inexpensive arrangement which can reliably connect the lead pins 23, 24 and 25 to the wirings while the pins extend straight.

The pair of protrusions 97 which is used to mount the base 91 on the external board are formed on the base 91 at only the two positions 180° rotationally symmetric about the center of the base 91. Therefore, a plurality of optical modules M1 can be placed in parallel without interference between the protrusions 97 of the modules M1. This decreases the mounting area for the modules M1 to downsize an optical communication apparatus including the modules M1.

The fifth and sixth wirings 74 and 75 are located on the both sides of the first wiring 70 and surround it. The sixth and seventh wirings 75 and 76 are located on the both sides of the second wiring 71 and surround it. As a consequence, the first and second wirings are surrounded by the ground wirings. In addition, the fifth and seventh wirings 74 and 76 are electrically connected to the stem 11 through the auxiliary wiring members 80. This makes it possible to easily reduce the impedances of the first and second wirings 70 and 71.

Second Embodiment

In the first embodiment, the light-receiving device 31 is used as a semiconductor optical device. In contrast, in the second embodiment, a semiconductor light-emitting device is used as a semiconductor optical device instead of the semiconductor light-receiving device. In this case, for example, the optical module has a light-emitting sub-module, wiring board and package.

Figure 13:
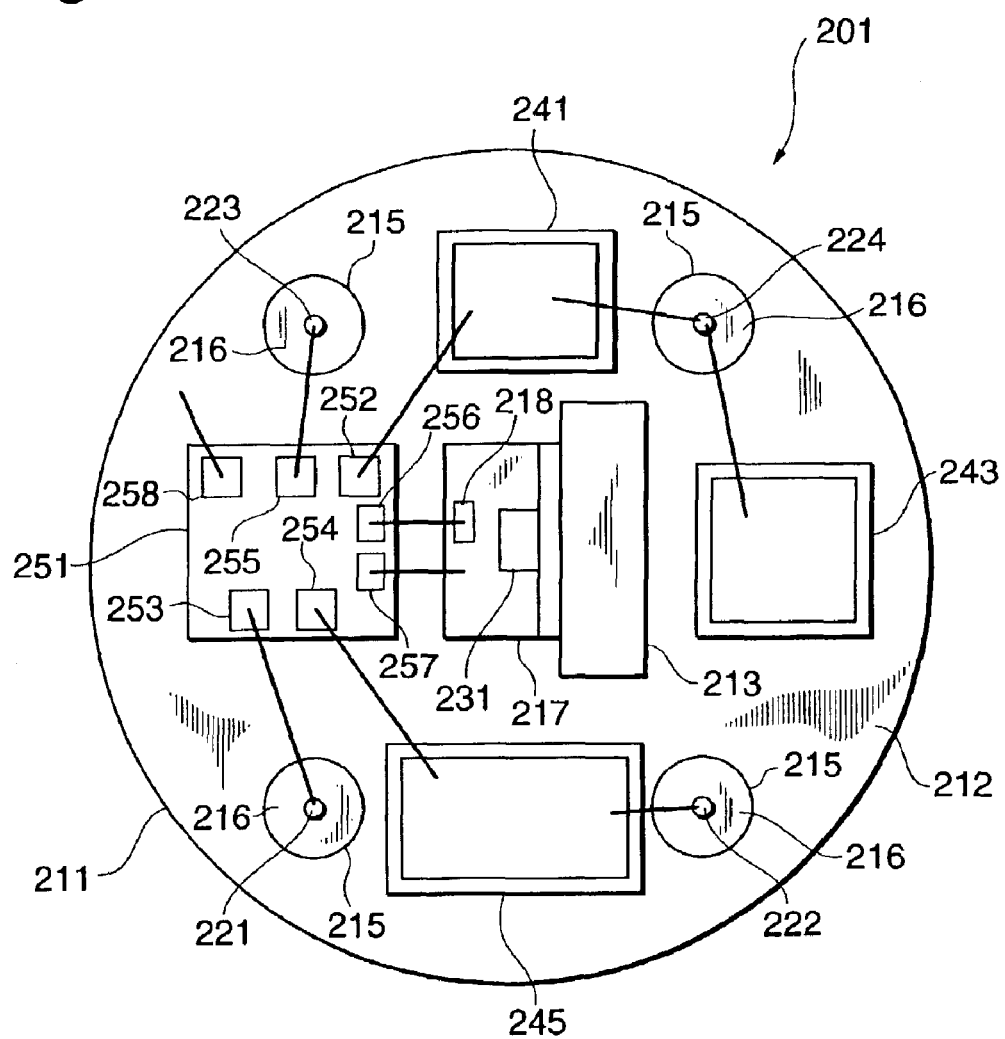
FIG. 13 is a plan view showing the arrangement of a device portion included in a light-emitting sub-module in an optical module according to a second embodiment.
Figure 14:
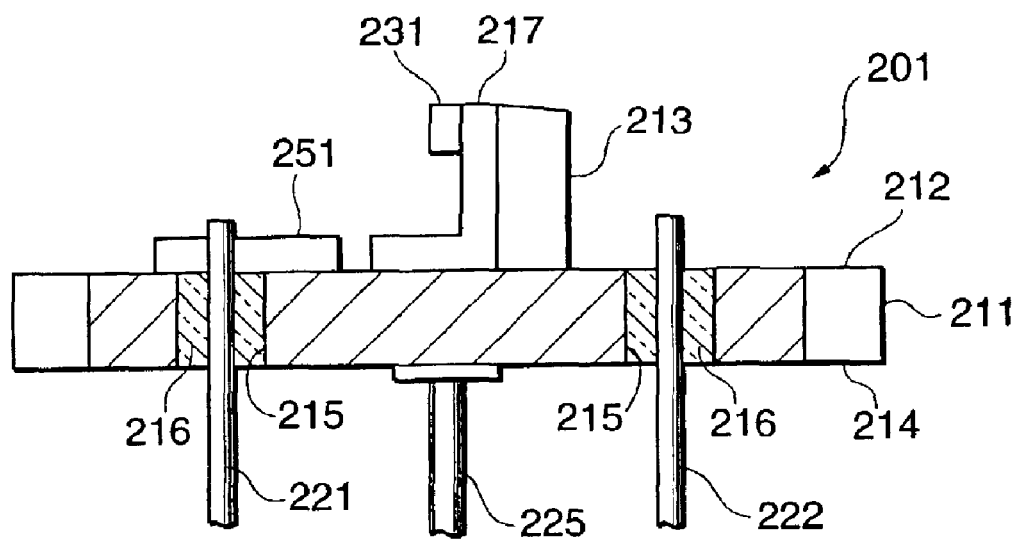
FIG. 14 is a sectional view showing the arrangement of the device portion included in the light-emitting sub-module in the optical module according to the second embodiment.

The configuration of a device mounting portion in this embodiment will now be described with reference to FIGS. 13 and 14. FIG. 13 is a plan view showing the configuration of the device portion. FIG. 14 is a sectional view showing the configuration of the device portion.

The device portion 201 has a stem 211. The stem 211 has die-capacitors 241 to 245, a mounting surface 212 on which electrical parts like a semiconductor electronic device 251 are mounted, and a back surface 214 located on the opposite side of the mounting surface 212. A block 213 for mounting a semiconductor light-emitting device 231 stands upward from the mounting surface 212. The block 213 is a flat plate extending vertically from the mounting surface 212. The stem 211 has a plurality of (four in this embodiment) through holes 215 extending from the mounting surface 212 to the back surface 214. Lead pins 221 to 224 extend through the respective holes 215. A lens holder (not shown) abuts the stem 211.

The lead pins 221 to 224 extend through the respective holes 215 so that one end of each pin protrudes from the mounting surface 212 by a predetermined length (e.g., about 0.35 mm), and are fixed to the stem 211. The other end of each of the lead pins 221 to 224 protrudes from the back surface 214. The lead pins 221 to 224 are insulated from the stem 211 by sealing with a glass sealant 216 filling the holes 215.

The lead pin 221 is for transmitting a control signal $V_b$ of a bias current to the semiconductor electronic device 251. The lead pin 222 is for transmitting a control signal $V_m$ of a modulation current to the electronic device 251. The lead pin 222 is wire-bonded and electrically connected to an electrode of the die-capacitor 245. The lead pin 223 (signal pin) is for transmitting an input signal to the electronic device 251. The lead pin 224 is for applying a power supply voltage $V_{DD}$ to the electronic device 251. The lead pin 224 is wire-bonded and electrically connected to an electrode of the die-capacitor 241. The lead pin 224 is also electrically connected to an electrode of the die-capacitor 243. A lead pin 225 (ground pin) is fixed to the back surface 214. One end of the lead pin 225 protrudes from the back surface 214.

The semiconductor light-emitting device 231 is, for example, a laser diode, and mounted on an L-shaped chip carrier 217 provided on the mounting surface 212. One part of the L-shaped chip carrier 217 extends along the mounting surface 212, and the other part extends almost vertically from the mounting surface 212 along the protrusion portion 213. An impedance-matched wiring pattern (not shown) is formed on the chip carrier 217.

The semiconductor electronic device 251 is, for example, a driving IC for the light-emitting device 231. The electronic device 251 is for generating an electric signal to be sent to the light-emitting device 231 by an electric process. The electronic device 251 has first to sixth electrodes 252 to 257, a ground electrode 258, and the like. The electronic device 251 is placed on the mounting surface 212 to be adjacent to the chip carrier 217 so that the fifth electrode 256 faces an electrode 218 of the chip carrier 217. In this embodiment, the electronic device 251 is placed between the lead pins 221 and 223.

The first electrode 252 is for applying a power supply voltage to the electronic device 251 and is wire-bonded and electrically connected to an electrode of the die-capacitor 241. Therefore, a power supply voltage is applied to the electronic device 251 through the lead pin 224, the electrode of the die-capacitor 241 and the wire.

The second electrode 253 is for inputting the control signal of the bias current to the electronic device 251 and is wire-bonded to the lead pin 221. Therefore, the control signal of the bias current is input to the electronic device 251 through the lead pin 221 and wire.

The third electrode 254 is for inputting the control signal of the modulation current to the electronic device 251 and is wire-bonded and electrically connected to the die-capacitor 241. The third electrode 254 is wire-bonded to the lead pin 221. Therefore, the control signal of the modulation current is inputted to the electronic device 251 through the lead pin 222, die-capacitor 245 and wire.

The fourth electrode 255 is for inputting the electric signal to the electronic device 251 and is wire-bonded to the lead pin 223. Therefore, an electric signal is inputted to the electronic device 251 through the lead pin 223 and wire.

The fifth electrode 256 is for inputting the electric signal from the electronic device 251 to the light-emitting device 231 and is wire-bonded to the electrode 218 of the chip carrier 217. Therefore, an electric signal from the electronic device 251 is output to the light-emitting device 231 through the fifth electrode 256, the electrode 218, the wiring of the chip carrier 217 and the wire.

The sixth electrode 257 is for grounding the light-emitting device 231 and is wire-bonded to a ground electrode of the chip carrier 217.

The ground electrode 258 is wire-bonded to the mounting surface 12 of the stem 211 and set at ground potential.

Figure 15:
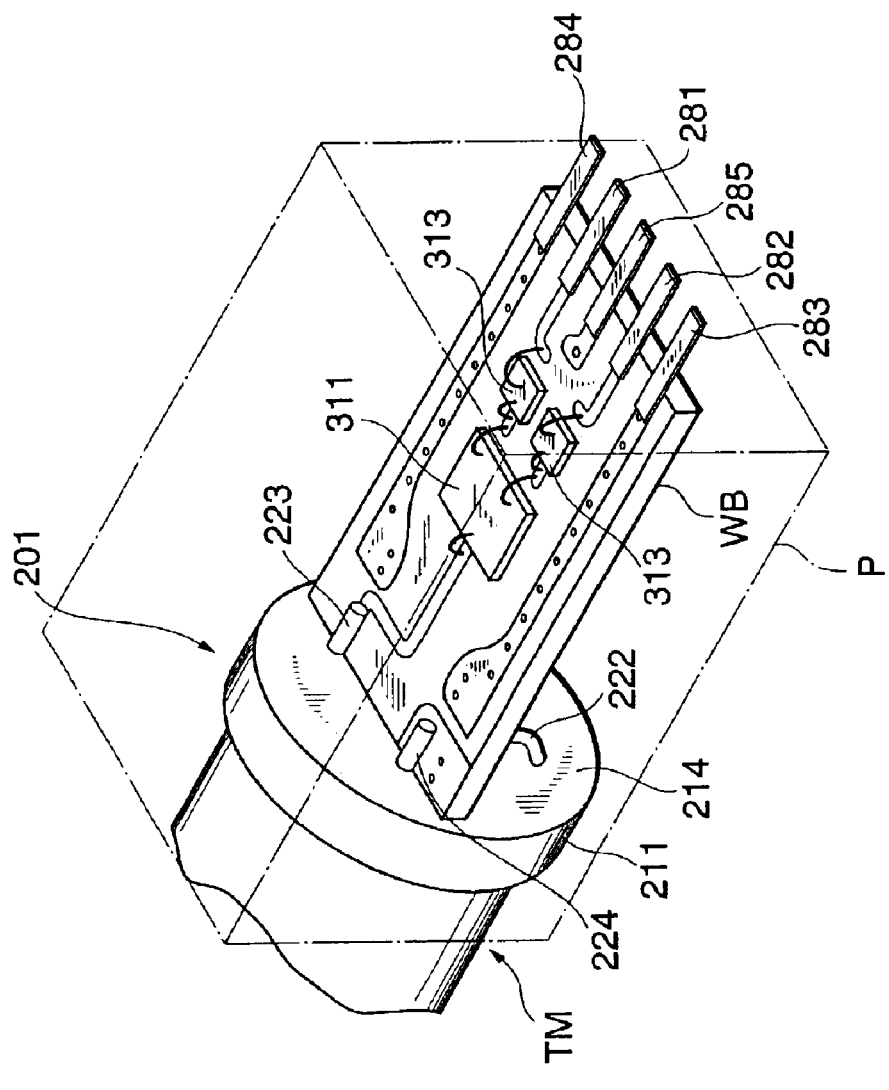
FIG. 15 is a perspective view showing a light-receiving sub-module and wiring board in the optical module according to the second embodiment.

A light-emitting sub-module TM including the device mounting portion 201 described above and a wiring board WB are connected as shown in FIG. 15. The device mounting portion 201 and wiring board WB are enclosed in the package P.

The wiring board WB is placed so that a plane including the central axes of the two lead pins 223 and 224 is nearby parallel to the wiring board WB, and one end of the wiring board WB is located near the back surface 214 of the stem 211. The back surface 214 may be in contact with the end of the wiring board WB. The wiring board WB is placed so that the lead pins 223, 224 and 225 can extend straight to the wirings formed on the wiring board WB. A semiconductor electronic device 311, a capacitor 313, electrodes 281 to 285, and the like are mounted on the wiring board WB. The electronic device 311 is, for example, an driving IC for converting a signal from the outside into a signal for driving the light-emitting device 231.

The advantages of this embodiment will be now described. Since the device mounting portion 201 and wiring board WB are enclosed in the metal package P, the leakage of the transmitted signals can be suppressed. In addition, since one end of the wiring board WB is placed near the back surface 214 of the stem 211, a signal transmission path from the wiring board WB to the light-emitting device 231 can be shortened. This suppresses the deterioration of the transmitted signals due to attenuation thereof.

The wiring board WB is placed so that the lead pins 223, 224 and 225 can extend straight to be connected to the wirings. This further suppresses the attenuation of the transmitted signals through the lead pin 223.

Third Embodiment

Figure 16:
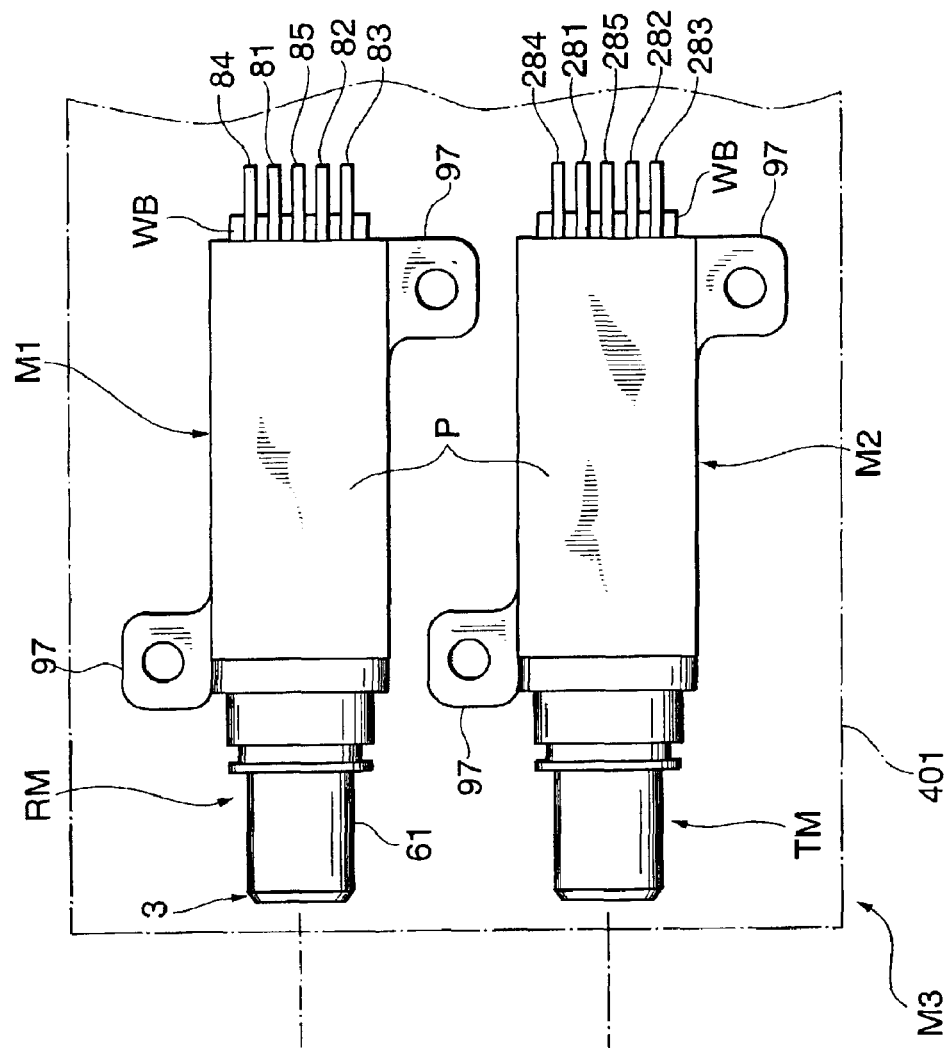
FIG. 16 is a plan view showing an optical transceiver module according to the third embodiment.

An embodiment of the optical transceiver module according to the present invention will now be described with reference to FIG. 16. As shown in FIG. 16, an optical module (receiving optical sub-assembly) M1 including a light-receiving device 31 and an optical module (transmitting optical sub-assembly) M2 including a light-emitting device 231 are paired and placed in a package 401 to constitute an optical transceiver module M3. In this case, the optical modules M1 and M2 are placed in parallel without interference between the protrusions 97 of the modules M1 and M2. Therefore, the transceiver module M3 can be formed very compact. The distance between the optical axes of the optical modules M1 and M2 can be set to 13 mm or less. Consequently, the optical modules M1 and M2 can be enclosed in a standard package defined by the XENPAK MSA, for example.

Figure 12:
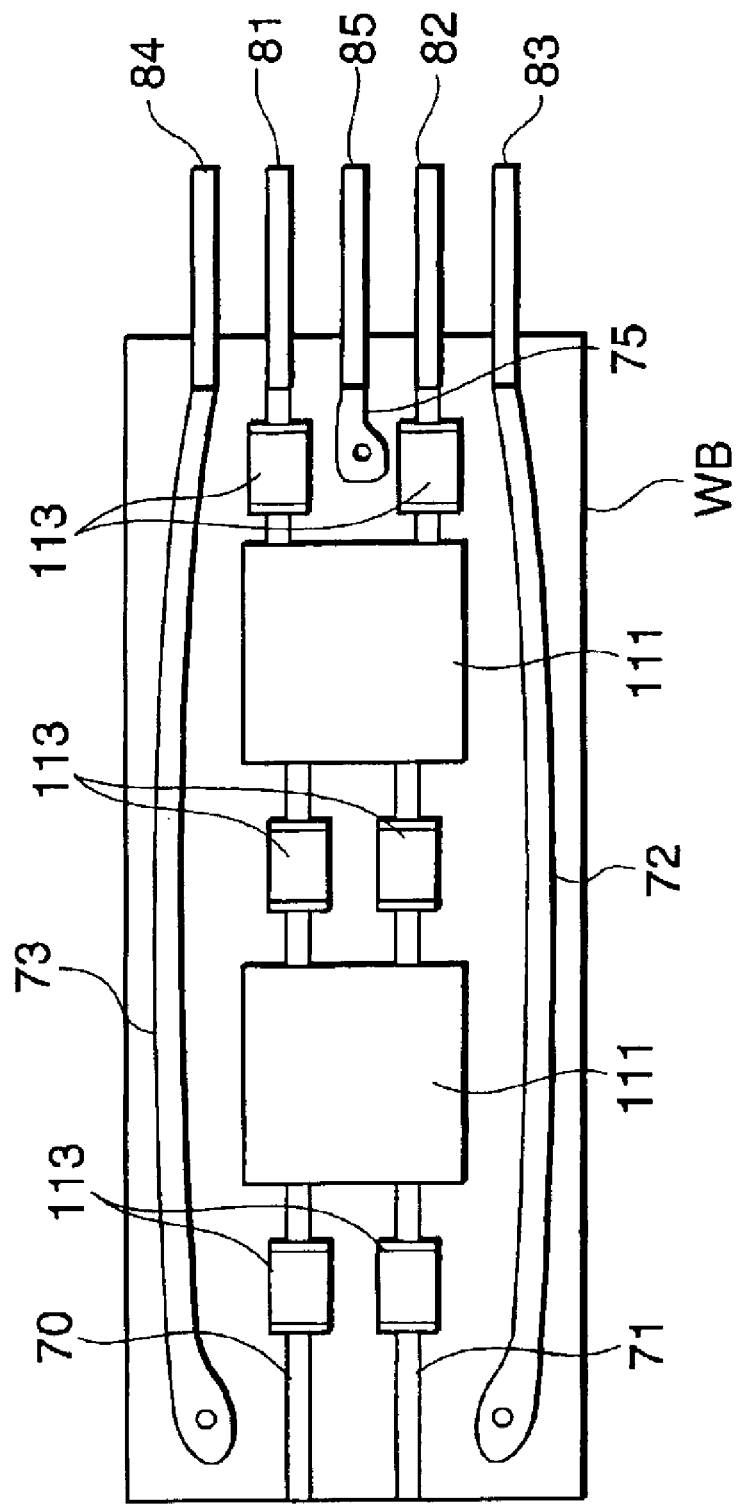
FIG. 12 is a plan view showing another example of the wiring board.

The present invention is not limited to the above embodiments, and can be variously modified. For example, as shown in FIG. 12, a semiconductor electronic device 111 (e.g., a limiting amplifier IC), a capacitor 113, and the like may be mounted on one of the major surfaces of the wiring board WB.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical module comprising:
   a semiconductor optical device;
   a stem having a mounting surface on which said semiconductor optical device is mounted, and a back surface opposite to the mounting surface;
   a plurality of lead pins inserted into said stem, each lead pin having a first end portion which is exposed on said mounting surface, and a second end portion protruding from said back surface;
   a wiring board having an end portion located near said back surface and a plurality of wirings extending to said end portion of said wiring board, said second end portions of said plurality of lead pins being connected to said wirings; and
   a package for enclosing said wiring board, said package having a base and a lid,
   wherein one of said plurality of lead pins is a signal pin for transmitting an output signal from said semiconductor optical device or an input signal to said semiconductor optical device,
   wherein said wirings includes a signal wiring connected to said signal pin, and ground wirings provided on both sides of said signal wiring, and
   wherein said wiring board further includes an auxiliary wiring member for electrically connecting said ground wirings to said stem.

2. The optical module according to claim 1, wherein said semiconductor optical device is a semiconductor light-receiving device for receiving an optical signal to generate a photocurrent corresponding to the optical signal, and wherein said optical module further comprises:
   a preamplifier for receiving said photocurrent from said light-receiving device to generate an electric signal corresponding to said photocurrent, said preamplifier being placed on said mounting surface of said stem; and
   a main amplifier for amplifying the electric signal generated by said preamplifier, said main amplifier being placed on said wiring board, and
   wherein said wiring on said wiring board extends from said main amplifier to said end portion of said wiring board.

3. The optical module according to claim 2, wherein said preamplifier is wire-bonded to said first end portion of one of said plurality of lead pins and said light-receiving device.

4. The optical module according to claim 1, wherein said semiconductor optical device is a semiconductor light-emitting device for emitting light in response to an driving signal,
   wherein said optical module further comprises a light-emitting device driving circuit which is placed on said wiring board and generates said driving signal for said light-emitting device, and
   wherein said wiring on said wiring board extends from said driving circuit to said end portion of said wiring board which is located near said back surface of said stem.

5. An optical transceiver module comprising a first optical module according to claim 2 and a second optical module according to claim 4, wherein each base of said first and second optical modules has a pair of protrusions for fixing said base to an external board,
   wherein said pair of protrusions is provided at only two positions 180° rotationally symmetric about a center of said base in each optical module, and
   wherein said first and second optical modules are placed in parallel without interference between said threaded protrusions of said first and second modules.

6. An optical transceiver module comprising a first optical module according to claim 2 and a second optical module according to claim 4, wherein each base of said first and second optical modules comprises:
   a substantially flat contact surface which abuts an external board when said base is fixed to said external board; and
   a pair of protrusions protruding in opposite directions from said base, each protrusion having a hole for fastening said base to said external board, and a bottom surface substantially flush with said contact surface,
   wherein said pair of protrusions is provided at only two positions 180° rotationally symmetric about an axis which is perpendicular to said contact surface and extends through a center of said package, and
   wherein said first and second optical modules are placed in parallel without interference between said threaded protrusions of said first and second modules.

* * * * *